United States Patent [19]

Koyanagi et al.

[11] Patent Number: 5,760,997
[45] Date of Patent: Jun. 2, 1998

[54] FLEXIBLE CABLE STRUCTURE FOR MAGNETIC DISK DRIVES

[75] Inventors: Ichiroh Koyanagi, Yokohama; Hiroshi Matsuda, Zama; Shinichi Matsuzaki, Fujisawa; Koji Serizawa, Zama; Keishi Takahashi, Fujisawa, all of Japan

[73] Assignee: International Business Machines Corporation, Armonk, N.Y.

[21] Appl. No.: 810,962

[22] Filed: Feb. 27, 1997

Related U.S. Application Data

[63] Continuation of Ser. No. 531,432, Sep. 21, 1995, abandoned.

[30] Foreign Application Priority Data

Sep. 29, 1994 [JP] Japan ............... 6-234890

[51] Int. Cl.$^6$ ............... G11B 5/012; G11B 33/00; H05K 1/00; H01R 9/09
[52] U.S. Cl. ............... 360/97.01; 360/98.01; 174/254; 439/67
[58] Field of Search ............... 360/97.01, 97.02, 360/97.03, 98.01; 179/254; 361/736, 748, 749, 752, 760, 761; 439/67, 74–77, 79

[56] References Cited

U.S. PATENT DOCUMENTS

| 4,923,406 | 5/1990 | Bucknam | 439/77 |
|---|---|---|---|
| 5,095,396 | 3/1992 | Putnam et al. | 360/106 |
| 5,241,438 | 8/1993 | Matsushima | 360/105 |
| 5,276,572 | 1/1994 | Kinoshita et al. | 360/97.01 |
| 5,337,202 | 8/1994 | Jabbarai et al. | 360/97.01 |
| 5,396,384 | 3/1995 | Calderira et al. | 360/98.01 |
| 5,499,161 | 3/1996 | Hosseinzadeh et al. | 361/749 |
| 5,508,860 | 4/1996 | Takagi et al. | 360/97.01 |

FOREIGN PATENT DOCUMENTS

2-170495  7/1990  Japan.

Primary Examiner—Stuart S. Levy
Assistant Examiner—William J. Klimowicz
Attorney, Agent, or Firm—Baker Maxham Jester & Meador

[57] ABSTRACT

In a hard disk drive, power and signals are transferred through a flexible cable 42 between a carriage having a magnetic head reading magnetic information while the positioning of the magnetic head is controlled on a magnetic disk and a card provided on the lower surface of a base. The movable section 44 of the flexible cable 42 is supported by the carriage to follow the carriage. A nonmovable section 46 is bent so as to enclose a reinforcement plate 50 and installed on the base through the reinforcement plate 50. The reinforcement plate 50 is used as a reinforcement for installing an AE module 54 on the upper surface 52 thereof. The reinforcement plate is also used as a reinforcement for connecting a carriage connector 84 to the card 40 through the lower surface 60 thereof. The reinforcement plate is used for maintaining an attitude to maintain the attitude of the movable section 44 in the lateral direction on a surface 64 of thickness of the plate. One reinforcement plate is needed for performing these operations.

30 Claims, 6 Drawing Sheets

FLEXIBLE CABLE STRUCTURE FOR MAGNETIC DISK DRIVES

This application is a continuation of application Ser. No. 08/531,432, filed Sep. 21, 1995, now abandoned.

BACKGROUND OF THE INVENTION

1. Field of the Invention

This invention relates to a flexible cable structure for a magnetic disk drive such as a hard disk drive (HDD), and a magnetic disk drive.

2. Description of the Related Art

In a small magnetic disk drive such as a hard disk drive (HDD), a magnetic disk is contained in an enclosure case the base of which is closed by a cover, the magnetic disk being driven and rotated by a spindle motor installed on the inner surface of the base. A carriage is also installed in the enclosure case, and rotated by an actuator using a voice coil motor (VCM) and the like for controlling the positioning of a magnetic head on the end of the carriage on the magnetic disk so that it can read and write magnetic information. A card constituting a circuit board is installed on the outer surface of the base. Here, a flexible prime cable (FPC) is used for transferring signals between the card and the magnetic head, and for supplying power to a VCM coil.

Figure 9:
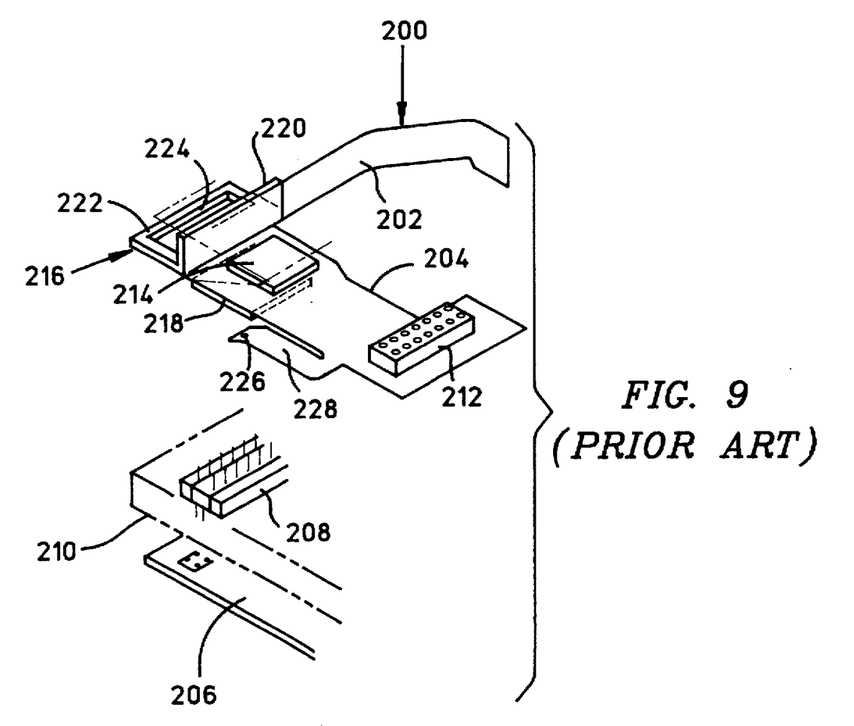
FIG. 9 is a perspective view showing a conventional flexible structure.

As shown in FIG. 9, the FPC 200 is formed in a flexible flat shape, and integrally provided with a movable section 202 and a nonmovable section 204. The movable section 202 is supported on the carriage, and connected to the magnetic head and the VCM coil to follow the carriage. The nonmovable section 204 has a carriage connector 212. The base 210 of the enclosure case is provided with a junction connector 208 which is connectable to the carriage connector 212 and also to the card 206. The nonmovable section 204 also has installed on it electrical components such as an AE module 214, and has installed a reinforcement plate and a reinforcement film for stabilizing the assembly and maintaining the shape. According to the example shown in FIG. 9, the reinforcement plate has a separate bent plate 216, which is bent, for example, in an L-shape, and a rectangular plate 218. One end 220 of the bent plate 216 is used as reinforcement to maintain the attitude of the movable section 202 in the lateral direction (maintaining of verticality), and the other end 222 is formed in the shape of a frame, and it is used for reinforcing the connection to the junction connector 208 with the peripheral part of the carriage connector 212 abutting the frame edge when the carriage connector 212 is connected to the junction connector 208 in a frame 224. The rectangular plate 218 is used for reinforcement to install the AE module 214 on the nonmovable section 204. In order to install the FPC 200 on the base 210, the nonmovable section 204 is bent so as to be folded back, as illustrated by the double-dot-and dashed lines in FIG. 9, so that the carriage connector 212 is located in the frame 224 of the other end 222 of the bent plate 216. In FIG. 9, reference numeral 226 designates a ground contact. The ground contact 226 is formed on the end of a branch end 228 individually protruding in an L-shaped form from the nonmovable section 204.

The cost of the FPC depends on the number of reinforcement plates, and therefore the number of reinforcement plates should preferably be kept small. If the number of reinforcement plates is reduced, however, then the degree of freedom for assembling the FPC and other components is compromised. This causes the shape to be disadvantageously large and further complicated. Additionally, with the limitation on space coupled with the small size of the FDD, it is difficult to decrease the number of reinforcement plates.

Further, it should be noted that the enclosure is required to be air-tight. Upon connection between the card on the outside of the enclosure and the FPC on the inside of the enclosure, the air-tightness becomes a significant factor. Conventionally, in order to achieve such air-tightness, the carriage connector has been bonded to the base, a condition of sealing has been established by adhesive tape, or a means for passing the nonmovable section of the FPC through a seal component between the base and the cover has been adopted. However, it is to be anticipated that the above described means causes a decrease in the air-tightness of the enclosure.

In addition, as stated above, the reinforcement plates are essential to maintain the specified shape of the FPC. The assembled configuration of the FPC becomes arbitrary depending on the shape of the reinforcement plate. If the configuration of the FPC is too complicated, however, the installation of the electrical components and processing thereof become complicated, which results in a rise in the cost. Electrical components are installed on both sides of the FPC, which, on the one hand, may provide such advantages as a compact size to the FPC and a degree of freedom upon assembling the FPC. On the other hand, however, this causes the cost to be raised disadvantageously. The individual reinforcement plates are respectively bonded to the FPC so that surface areas to be bonded increase, which also results in an undesirable rise in the cost.

It is necessary to transfer signals and power not only between the card and the carriage but also between the card and the motor. For connecting the card to the carriage, and the motor, there is proposed a means for individually connecting them at two points, and a means for integrating one with the other and connecting the thus integrated components with the rest of them at one point. In the case of the means for individually connecting them at two points, a flexible cable or a conductive rubber component and the like is employed to absorb relative error at the connection points. In the case of the flexible cable, consideration must be given to a length which accommodates the assembly of the base and the card. In the case of an HDD of 2.5 inches or less, the height is limited. Therefore, a zero-insertion-force (ZIF) connector (nonpressure type) is employed. Since the flexible cable is expensive, if the length thereof is increased, the cost thereof will be further increased. The increase in the length of the flexible cable also results in the degradation in external noise resistance performance. In the case of the conductive rubber component, installation parts must undergo cutting in such a manner that the three-dimensional positional accuracy between contactors using the conductive rubber component and the dimensional accuracy of the contactors themselves have a postassembly error of ±0.2 mm or less. This results in the disadvantageous raising of the cost. If a multipoint connection is carried out at one point while the above-mentioned dimensional accuracy is maintained, the cost per area of the connecting part is higher than that of the flexible cable. The conductive rubber component may be replaced by a spring tab. With this spring tab, problems encountered in the conductive rubber component can be solved. The tabs must be installed individually, however, so that the assembly and packaging density become inferior to those of the flexible cable.

In the case of the means for integrating one with the other and connecting the thus integrated components to the remaining components, a connecting material for integrating and connecting them and special operations for applying it are required. In this case, connectors of a pin socket type are employed and are installed on both sides of the enclosure case and the card. Even when displacement or misalignment generated in installing the connectors is, for example, one of about ±0.5 mm, a large misalignment is caused in threaded parts for installing the card on the outer surface of the base because of a level ratio. If a connection operation is made under this condition, then a distortion will be generated between the connector of the base side and the card, which causes a failure in air-tightness to be generated and the soldering for the modules on the card to fall off.

It is an object of the present invention is to provide a flexible cable structure and a magnetic disk drive in which the assembly characteristics of the magnetic disk drive can be improved and a low cost is realized.

SUMMARY OF THE INVENTION

In order to solve the above described problems, a flexible cable structure for a magnetic disk drive according to the present invention comprises a carriage contained in an enclosure case and having a magnetic head for reading magnetic information and the like while positioning is controlled on a magnetic disk; a circuit board installed on the outer surface of the enclosure case; a flexible cable of a flat shape which is provided in the enclosure case for connecting the carriage and the circuit board; and a reinforcement plate formed in the enclosure case and capable of being installed in the enclosure case so as to cover a connection aperture opened to the circuit board; wherein the flexible cable is provided with a movable section supported by the carriage and moved following the carriage and a nonmovable section bent so as to enclose the reinforcement plate and supported on the reinforcement plate, the movable section and the nonmovable section are integrally and continuously formed, and the nonmovable section is provided with a connecting part through which installation parts to be installed with electrical components on the outer surface thereof including an installation part to be installed with a carriage connector which are connected to the circuit board through the aperture are connected to the movable section.

A flexible cable structure for a magnetic disk drive of the present invention is further characterized in that, the movable section is dislocated in the lateral direction with respect to the connecting part.

A flexible cable structure for a magnetic disk drive of the present invention is further characterized in that, the movable section is provided with a slit formed on the nonmovable section side and the bent position of the connecting part may be varied along the slit.

A flexible cable structure for a magnetic disk drive of the present invention is further characterized in that, a seal component is provided on the periphery of the carriage connector between the installation part to be installed with said carriage connector and the edge of said connection aperture so that the seal component is pressed by installing the reinforcement plate.

A magnetic disk drive of the present invention includes a motor installed with a magnetic disk for driving and rotating the magnetic disk; a carriage having a magnetic head for controlling the position of the magnetic head on the magnetic disk so that it can read magnetic information and the like; an enclosure case for containing the motor and the carriage therein; a motor connector connected to the motor and exposed on the outer surface of the enclosure case; a carriage connector connected to the carriage connector and exposed on the outer surface of the enclosure; a circuit board installed on the outer surface of the enclosure case, and having a connecting part in contact with and connected to the motor connector and a connecting part in contact with and connected to the carriage connector, the circuit board transmitting and receiving signals and power between the circuit board, the motor, and the carriage; and an engagement means for recessed and projected parts provided between the outer surface of the enclosure case and the motor connector, between the outer surface of the enclosure case and the carriage connector, and between the outer surface of the enclosure case and the circuit board, and for respectively positioning between them.

A magnetic disk drive of the present invention is further characterized in that, the motor connector and the carriage connector are provided with spring contacts.

The reading of magnetic information and the like includes any one operation of reading, writing and deleting operations of magnetic information or the combination thereof. According to the construction described here, the positioning of the magnetic head is controlled on the rotating magnetic disk so that operations such as the reading of the magnetic information are performed. At this time, the movable section of the flexible cable moves following the carriage. A read signal and the like are transmitted and received through the flexible cable between the magnetic head and the circuit board.

The nonmovable section of the flexible cable is bent so as to enclose the reinforcement plate which serves as reinforcement for installing electrical components on the respective surfaces of the nonmovable section. The reinforcement plate also serves as a reinforcement component for connecting the carriage connector to the circuit board as well as one for maintaining the attitude of the movable section in the lateral direction. One reinforcement plate meets these purposes, including the reinforcement of the components described above and the attitude maintenance of the movable section.

Since the nonmovable section of the flexible cable is so bent as to enclose the reinforcement plate and the outer surfaces of the respective parts of the nonmovable section which correspond to those of the reinforcement plate are formed as faces to be installed with electrical components, the same effect as that in the case of installing the electrical components on both sides of the nonmovable section can be obtained.

One part of a surface of the nonmovable section of the flexible cable is used as a surface to be bonded to the reinforcement plate and other part thereof is simply bent (folded), so that the configuration of the flexible cable to be installed in the enclosure case can be formed and the assembly thereof is simplified. Therefore, the number of reinforcement plates can be reduced, the shape of the reinforcement plate can be simplified, and space saving can be achieved, which contributes to simplifying processes and lowering the cost. As a result, the assembly of the magnetic disk drive can be simplified and the cost can be reduced.

According to the invention, the movable section is dislocated in the lateral direction with respect to the connecting part, so that the movable section can maintain an appropriate position in the limited space in the enclosure case. Further, the developed shape of the flexible cable is made optimum. Even if the thickness of the reinforcement plate is decreased, the electrical components such as an AE module which are provided in the part of the nonmovable section to be installed with them can be arranged at proper points while the dimensions of the movable section in the lateral direction are maintained, and problems of noise can be overcome.

According to the invention, the movable section is provided with a slit formed on the nonmovable section side and therefore, the bent position of the connecting part may be varied along the slit. Therefore, with the same flexible cable employed, for example, the point where the nonmovable section surrounds the reinforcement plate is changed, or the dimensions of the reinforcement plate are changed, so that the position of the movable section in the lateral direction can be changed.

According to the invention, a seal component is provided in the periphery of the carriage connector between the installation part to be installed with said carriage connector and the edge of the connection aperture so that the seal component is pressed by installing the reinforcement plate. Therefore, air-tightness is not degraded and is easily maintained.

According to the invention, the motor connector and the carriage connector are connected to the connecting parts on the circuit board which respectively correspond thereto, so that signals and power are transferred between the circuit board, and the motor and the carriage.

A positioning operation is carried out between the outer surface of the enclosure case and the motor connector, between the outer surface of the enclosure case and the carriage connector, and between the outer surface of the enclosure case and the circuit board. In addition, this is made by using an engagement means for recessed and projected parts. Therefore, the positions of the respective connecting parts on the circuit board can be accurately and readily aligned with the respective positions of the motor connector and the carriage connector. According to the invention, the connectors are provided with spring contacts so that the thickness of the magnetic disk drive can be reduced.

DESCRIPTION OF THE PREFERRED EMBODIMENTS

An embodiment of a flexible cable structure for a magnetic disk drive according to the present invention and a magnetic disk drive according to the present invention applied to a hard disk drive (HDD) will be described with reference to FIGS. 1 to 8.

Figure 2:
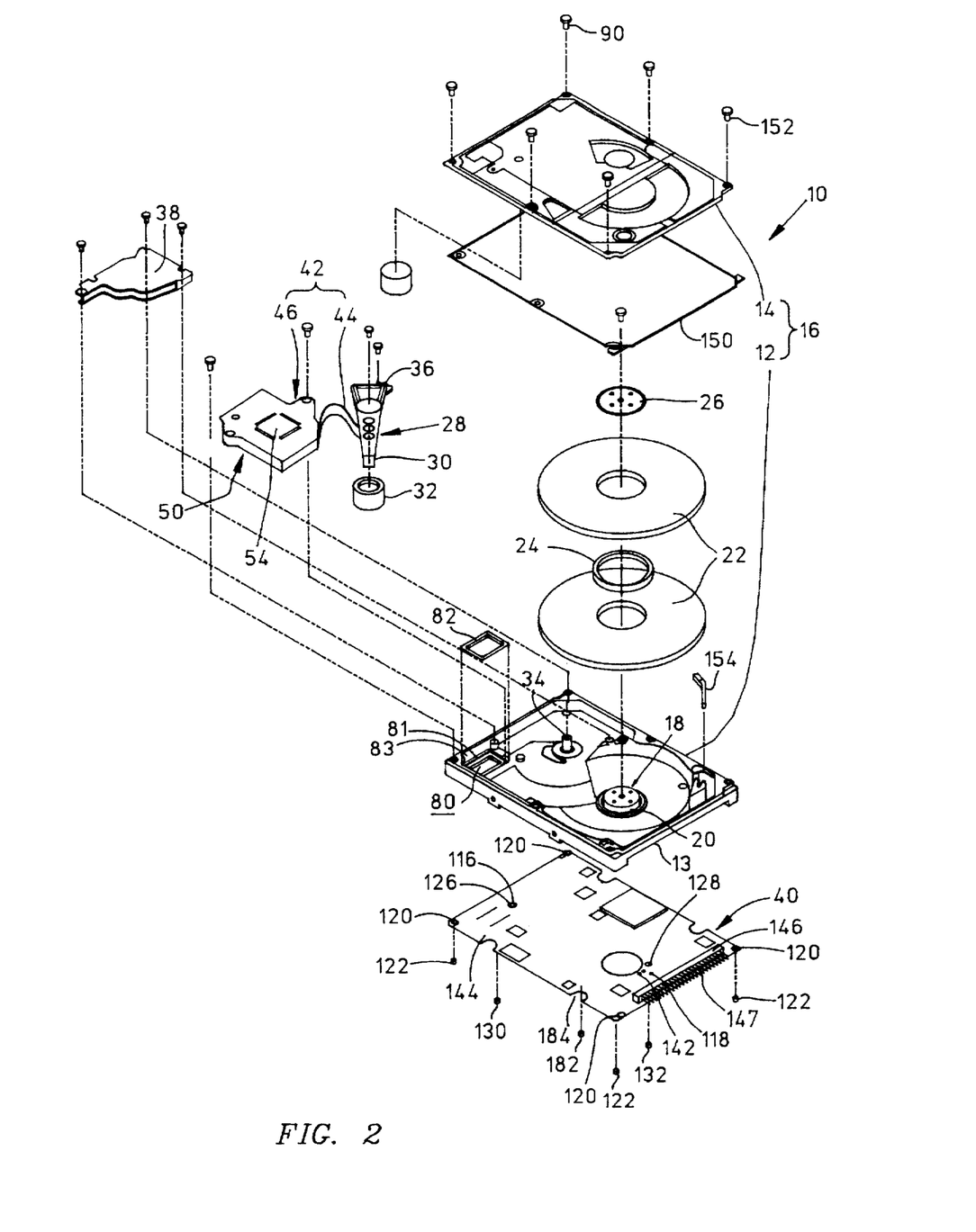
FIG. 2 is an exploded perspective view showing a hard disk drive to which an embodiment of the flexible cable structure for the magnetic disk drive and an embodiment of the magnetic disk drive.

As shown in FIG. 2, in a hard disk drive 10 as a magnetic disk drive, the opened upper part of a thin base 12 is closed with a cover 14 so that an enclosure case 16 is formed. The enclosure case 16 is formed in the shape of a rectangular and thin box and can be horizontally arranged in a computer. The cover 14 is fixed to the base 12 through a rectangular frame-shaped seal component 150 by means of machine screws 152, so that air-tightness in the enclosure 16 is obtained. In FIG. 2, reference numeral 154 designates an air filter. Air in the enclosure 16 is purified by the air filter 154.

In the enclosure case 16, a spindle motor 18 of a hub-in structure is provided on the base 12 rather near to the end part from the central part of the enclosure case 16. The outer periphery of the hub 20 of the spindle motor 18 is coaxially fitted with, for example, two magnetic disks 22 through a spacer 24 which are pressed and installed using a clamp 26. They are driven and rotated by the spindle motor 18. A carriage 28 is also provided in the enclosure case 16. The carriage 28 has one end part provided with a magnetic head 30. An intermediate part of the carriage 28 is supported by a pin 34 standing on the base 12 through a pivot 32. The carriage 28 is thus rotatable around the pin 34. The other end part of the carriage 28 is provided with a coil 36 for a voice coil motor (VCM). The carriage 28 is rotated by the VCM 38 provided in the enclosure 16 to operate in concert with the coil 36. The positioning of the magnetic head 30 is controlled on the magnetic disk 22 in the radial direction of the magnetic disk 22 by the VCM 38 so that magnetic information is read, written, or deleted and the like. The coil 36 and the VCM 38 constitute an actuator. A card 40 as a circuit board is installed on the outer surface (lower surface) of the base 12. The card 40 has a rectangular shape large enough to cover the outer surface of the base 12. Power such as power for driving the motor and signals are transferred between the card 40 and the spindle motor 18. Further, between the card 40 and the carriage 28, power and signals such as power to the coil 36 and the read signals of the magnetic head 30 are transferred.

Figure 3:
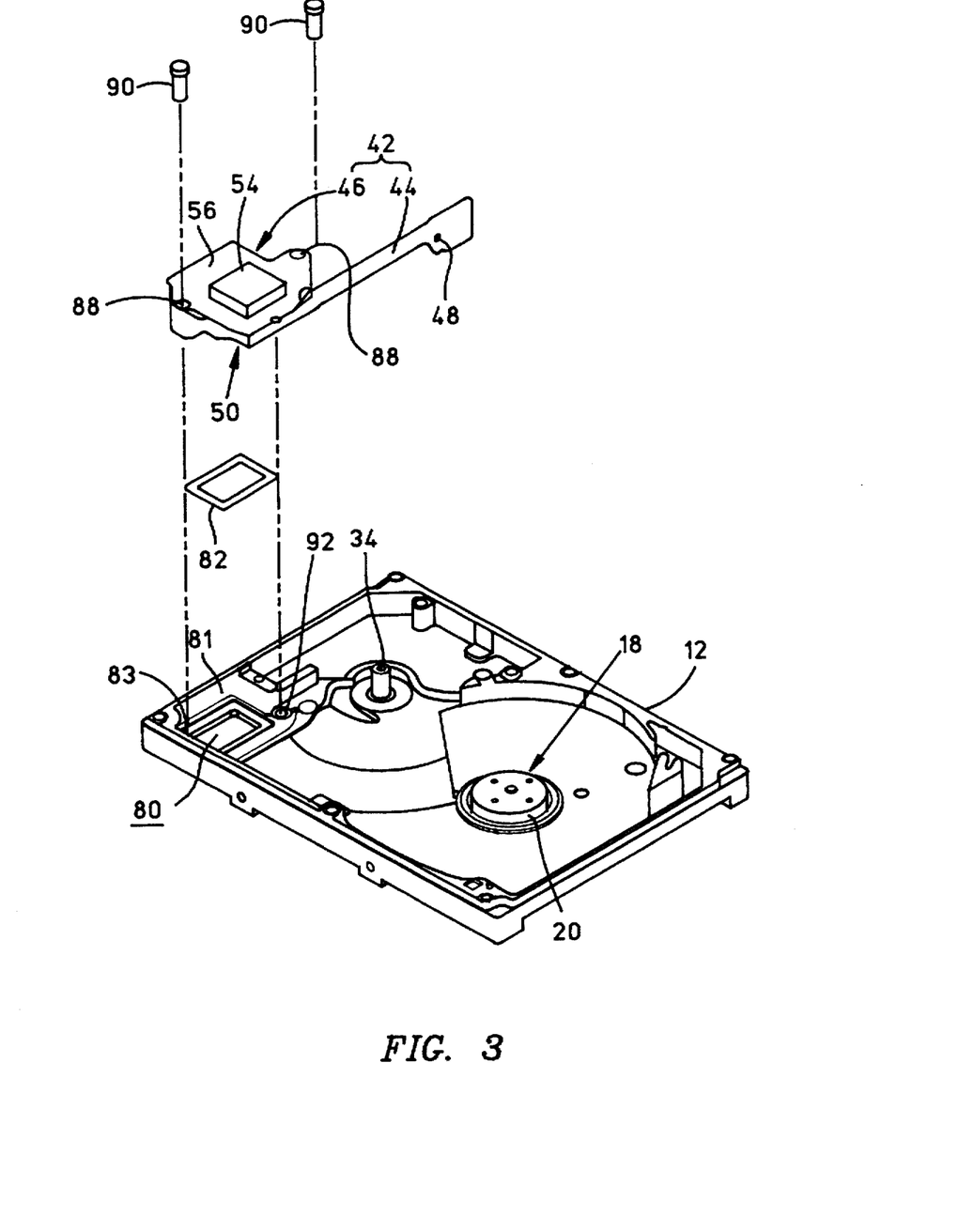
FIG. 3 is an exploded perspective view showing a relationship for installation between the flexible cable assembly and the base of an enclosure case.

The transmitting and receiving operations between the card 40 and the carriage 28 are carried out through a flexible cable (FPC) 42. As illustrated in FIGS. 1 and 3, the FPC 42 is formed with a flexible material and in a flat shape and provided with a nonmovable section 46 which is wide and extends in the lateral direction and a movable section 44 which is narrow in width and extends from the base end part of the nonmovable section 46 in the direction perpendicular to the extending direction of the nonmovable section 46. The movable section 44 and the nonmovable section 46 are provided integrated with each other. The extended end part of the movable section 44 is slightly increased in width and fixed to the side part of the carriage 28 through a machine screw by the use of a hole 48 formed therein. The movable section 44 can follow the rotating movement of the carriage 28 by virtue of the flexibility thereof.

The nonmovable section 46 is so bent along the extending direction of the nonmovable section 46 as to enclose a reinforcement plate 50 which is substantially rectangular in configuration. The intermediate part of the nonmovable section 46 is located on the upper surface 52 of the reinforcement plate 50. The intermediate part is used as a module installation part 56 to be installed with an AE module 54 on the outer surface thereof. The end of the direction of extension of the nonmovable section 46 reaches the lower surface 60 of the reinforcement plate 50 from one surface 58 of thickness of the reinforcement plate 50. The part of the nonmovable section 46 corresponding to the lower surface 60 of the reinforcement plate 50 is used as a connector installation part 62 to be installed with a connector 84 on the outer surface thereof. In FIG. 1, reference numeral 76 indicates a part corresponding to the one surface 58 of thickness of the reinforcement plate 50 on the end of the nonmovable section 46. The base end of the nonmovable section 46 reaches the lower surface 60 of the reinforcement plate 50 from the other surface 64 of thickness of the reinforcement plate 50. The part corresponding to the other surface 64 of thickness of the reinforcement plate 50 is employed as a connecting part 66 connected to the movable section 44. In FIG. 1, reference numeral 78 designates a part corresponding to the lower surface 60 of the reinforcement plate 40 in the base end side part of the nonmovable section 46.

Figure 5:
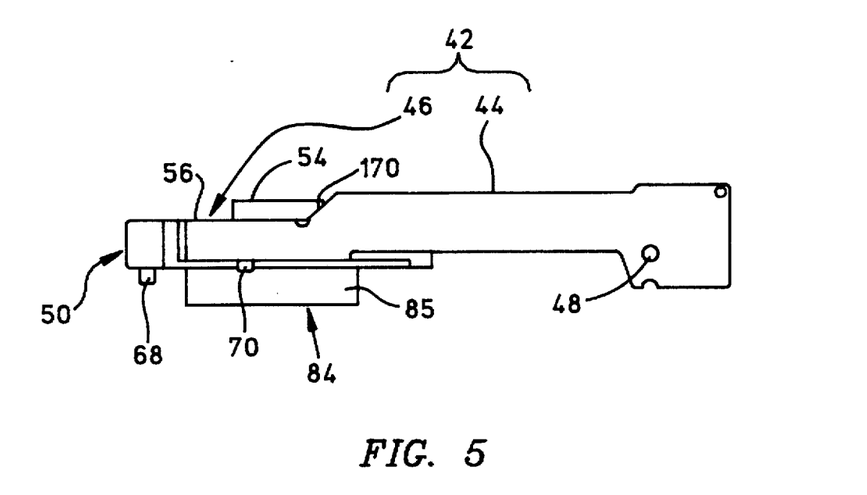
FIG. 5 is a view showing the flexible assembly seen from a side opposed to the movable section of the flexible cable.

In the nonmovable section 46, while a module installation part 56 is fixed to the upper surface 52 of the reinforcement plate 50, protrusions 68 and 70 are formed on the lower surface 60 of the reinforcement plate 50 (shown in FIG. 5). On the parts (62, 78) of the nonmovable section 46 corresponding to the lower surface 60 of the reinforcement plate 50, engagement holes 72 and 74 are respectively formed. While the protrusion 68 is engaged with the engagement hole 72, the protrusion 70 is engaged with the engagement hole 74. Thus, it is ensured that a configuration in which the nonmovable section 46 encloses the reinforcement plate 50 is effectively maintained.

A slit 170 is formed between the movable section 44 and the nonmovable section 46. The slit 170 is obliquely formed. Therefore, when the nonmovable section 46 is bent in such a manner that it encloses the reinforcement plate 50, the movable section 44 is dislocated in the lateral direction with respect to the connecting part 66. That is, as can be seen in FIG. 5, the upper edge of the movable section 44 is located at a position higher than that of the upper edge of the connecting part 66 (bent line 163 shown in FIG. 1(C)).

The assembly processes of a flexible assembly obtained by holding the FPC 42 on the reinforcement plate 50 will be sequentially described below with reference to FIG. 1. Initially, from a state where the nonmovable section 46 and the movable section 44 are provided on the same plane in an extended state (a state illustrated in FIG. 1(A)), the installation part 56 of the nonmovable section 46 is bonded to the upper surface 52 of the reinforcement plate 50 (see FIG. 1(B)). Then, a connector 84 is installed on a connector installation part 62 and an AE module 54 is soldered to the module installation part 56. Next, the nonmovable section 46 is bent along bent lines 160, 162, 163 and 164 shown by dashed lines in FIG. 1(C). As a result, as shown in FIG. 1(D), the configuration in which the nonmovable section 46 encloses the reinforcement plate 50 can be obtained.

Figure 4:
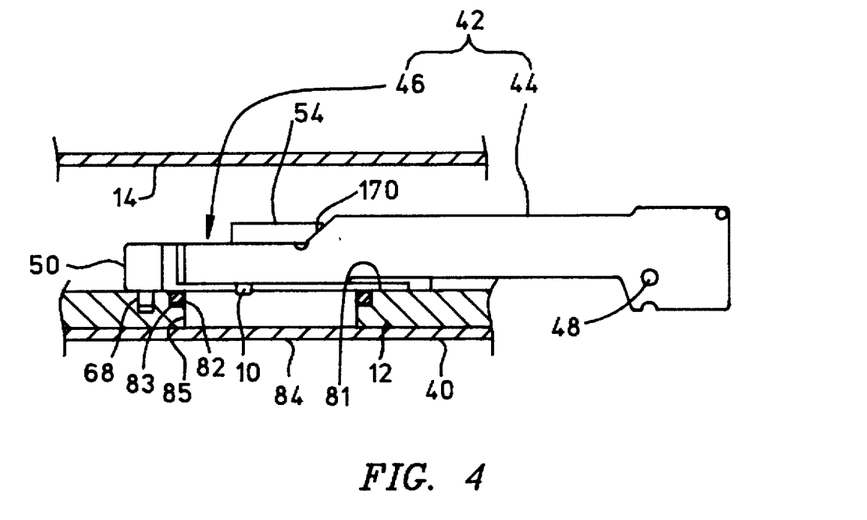
FIG. 4 is a longitudinally sectional view showing a condition in which the flexible cable assembly is installed on the base of the enclosure case.

As can be seen in FIG. 3, on the base 12, a rectangular connection aperture 80 opposed to the card 40 is formed and opened at a corner part spaced from a position where the spindle motor 18 is provided. On the peripheral edge 81 of the connection aperture 80, a stepped part 83 is formed so that a rectangular and frame-shaped seal component 82 is fitted to the stepped part 83. As shown in FIG. 4, the reinforcement plate 50 is installed on the base 12 so that the peripheral part of the connector installation part 62 of the nonmovable section 46 which corresponds to the lower surface of the reinforcement plate 50 abuts against the peripheral edge 81 of the connection aperture 80 through the seal component 82. A pair of screw through-holes 88 are formed on the reinforcement plate 50. Screws 90 are passed through the screw through-holes 88 and are threaded with internal threads 92 formed in the vicinity of the peripheral edge 81 of the connection aperture 80. Thus, the reinforcement plate 50 is fastened and fixed to the base 12. At this time, the connector 84 the peripheral part 85 of which is fitted in the connection aperture 80 is exposed on the outer surface of the base 12. The above described screws 90 are passed through through-holes 96 formed on the module installation part 56 of the nonmovable section 46 and through-holes 94 formed on the connector installation part 62 of the nonmovable section 46. Accordingly, it is insured that the nomnovable section 46 is held relative to the reinforcement plate 50 and to the base 12. The peripheral edge of one of the through-holes 96 formed on the module installation part 56 of the nonmovable section 46 is employed as a ground contact and for a ground through the screw 90.

Figure 6:
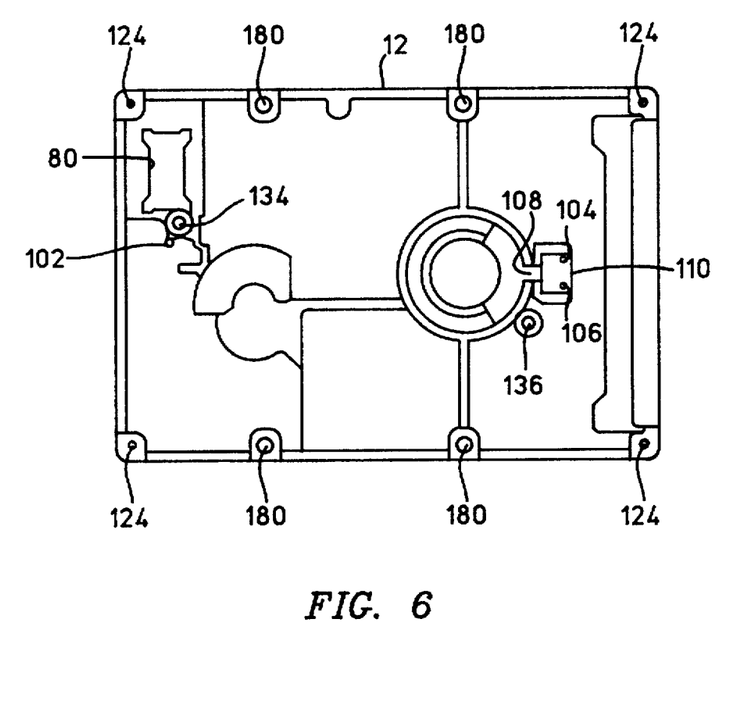
FIG. 6 is a view showing the lower surface of the base of the enclosure case.
Figure 7:
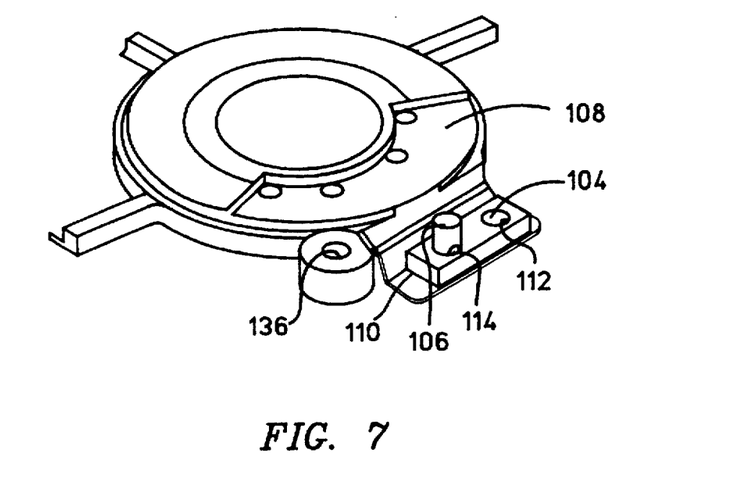
FIG. 7 is a perspective view, seen from a lower side, of parts in the base of the enclosure case which correspond to those of a spindle motor.
Figure 8:
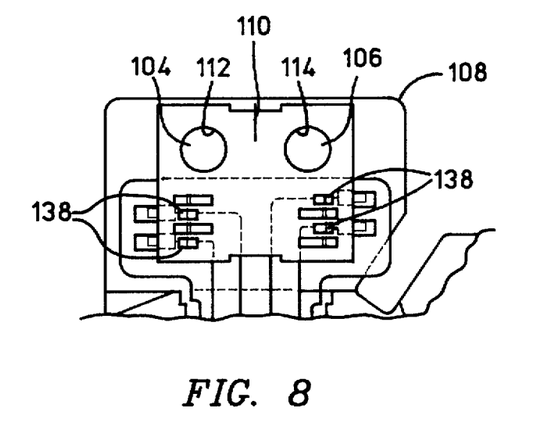
FIG. 8 is a view seen from a lower side, of the parts in the base of the enclosure case which correspond to those of the spindle motor.

As can be seen in FIG. 6, three positioning pins 102, 104, and 106 are projected and formed on the outer surface of the base 12. One (positioning pin 102) of the three positioning pins is located in the vicinity of the connection aperture 80 and other two (positioning pins 104, 106) are located side by side in the vicinity of a part corresponding to the spindle motor 18. Further, on the outer surface of the base 12, a flexible cable 108 is provided one end of which is connected to the spindle motor 18 in the part corresponding to the spindle motor 18. A motor connector 110 is provided on the other end of the flexible cable 108. The flexible cable 108 is flexible and formed in a flat shape. As illustrated in FIGS. 7 and 8, positioning holes 112 and 114 which correspond to the positioning pins 104 and 106 are formed in the motor connector 110 so that the positioning pins 104 and 106 are fitted into the positioning holes 112 and 114. One of the positioning pins 104 and 106 (positioning pin 106) extends longer than the other one (positioning pin 104) and protrudes from the positioning hole 114. As illustrated in FIG. 2, positioning holes 116 and 118 which correspond to the positioning pins 102 and 106 are formed on the card 40. The positioning pin 102 is fitted to the positioning hole 116 and the positioning pin 106 is fitted into the positioning hole 118. The base 12 is so formed that the bottom thereof is slightly raised and the peripheral edge of the lower surface of the base 12 is suspended. Machine screw holes 120 are respectively formed at the four corners of the card 40. At the four corners of the outer surface of the base 12, internal threads 124 (see FIG. 6) which correspond to the machine screw holes 120 are formed. When machine screws 122 passes through the machine screw holes 120 and are threaded with the internal threads 124, the card 40 is fixed to the lower surface of the base 12, while the peripheral part of the card 40 abuts on the peripheral edge of the lower surface of the base 12.

The motor connector 110 and the carriage connector 84 are respectively provided with spring contacts 138 and 140. Contact points 142 and 144 are formed on the card 40 at the positions where the spring contacts 138 of the motor connector 110 can come into contact, and the spring contacts 140 of the carriage connector 84 can come into contact, respectively, while the positioning pins 102 and 106 are respectively fitted into the positioning holes 116 and 118. On the card 40, machine screw holes 126 and 128 are respectively further formed in the vicinity of the positioning holes 116 and 118. Machine screws 130 and 132 respectively pass through the machine screw holes 126 and 128 and are threaded with internal threads 134 and 136 formed on the outer surface of the base 12. The machine screws 130 strengthen the contact between the spring contacts 140 of the carriage connector 84 and the contact point 144 of the card 40. The machine screws 132 strengthen the contact between the spring contacts 138 of the motor connector 110 and the contact point 142 of the card 40. Additionally, on the card 40, a flat connector 146 is provided along one side thereof. With the card 40 installed on the outer surface of the base 12, connector pins 147 of the flat connector 146 are exposed from a cutout 13 formed along one side of the peripheral edge on the lower surface of the base 12 which corresponds to the connector pins. Thus, the flat connector 146 can be connected to a main CPU. Further, on the peripheral edges on the lower surface of the base 12, internal threads 180 are formed. Screws 182 which are threaded with the internal threads 180 through cutouts 184 cut in a U-shaped form on the edge part of the card 40 are employed so that the base and the card are installed in the computer of an HDD.

According to the construction described above, the position of the magnetic head 30 is controlled on the rotating magnetic disk 22, so that magnetic information is read and the like. At this time, the movable section 44 of the flexible cable 42 moves following the carriage 28 and read signals and the like are transmitted and received between the magnetic head 30 and the card 40 through the flexible cable 42.

The flexible cable 42 is bent so as to enclose the reinforcement plate 50. The reinforcement plate 50 is used as a reinforcement to be installed with the AE module 54 on the upper surface 52 thereof. The reinforcement plate 50 is also used as a reinforcement to connect the carriage connector 84 to the card 40 on the lower surface 60 thereof. The reinforcement plate 50 is further used for maintaining an attitude to maintain the attitude in the lateral direction of the movable section 44 in the surface 64 of thickness of the plate. Only one reinforcement plate is required to satisfy the above stated operations.

The flexible cable 42 is bent to enclose the reinforcement plate 50 in such a manner that the outer surfaces of the respective parts of the nonmovable section 46 which correspond to the respective surfaces of the reinforcement plate 50 are surfaces to be installed with electrical components such as the AE module 54 and the carriage connector 84 and the like. Therefore, not only the surfaces of the FPC fixed to the reinforcement plate are used as surfaces to be installed with electrical components, but also the parts of the nonmovable section which correspond to the respective surfaces of the reinforcement plate can be used, which contributes to the achievement of the same effect as in the case of a double-sided installation. A part corresponding to the surface 58 of thickness of the reinforcement plate 50 may be also used as a part to be installed with electrical components as well as the above described embodiment. Two other surfaces except the upper surface 52, the lower surface 60, and the surfaces 58 and 64 of thickness of the plate among six surfaces of the reinforcement plate 50, if the nonmovable section is bent so as to be applied thereto, may be similarly usable as installation site.

In addition, the module installation part 56 of the nonmovable section 46 is employed as a surface to be bonded to the reinforcement plate 50 and other parts thereof are simply bent (folded), so that the installation shape of the nonmovable section 46 for installing the nonmovable section 46 on the base 12 can be formed. Accordingly, the assembly operation of the flexible cable structure can be simplified. As a result, the number of reinforcement plates can be decreased, the shape of the reinforcement plate can be simplified and space saving can be achieved, which contributes to the simplification of processes and the lowering of cost. Consequently, the assembly of the hard disk drive 10 is simplified and a cost is reduced.

It should be noted that the shape of the reinforcement plate is not limited to a type of a rectangular plate but to a type of a L-shaped plate. A material with which the reinforcement plate is formed may be preferably plastic or aluminum or the like. The L-shaped plate is composed of, for example, a long end and a short end. In this case, while the surface of the long end opposite to the short end is made to correspond to the upper surface 52 of the reinforcement plate 50, the surface of the short end is made to correspond to the connection aperture 80. The provision of a simple flat plate will permit cost to be more reduced. Further, the nonmovable section 46 of the flexible cable 42 in the surface 64 of thickness of the reinforcement plate 50 is obliquely chamfered (shown by 65 in FIG. 1(A)). Thus, the smooth and flexible deformation of the nonmovable section 46 can be ensured.

The ground of the flexible cable 42 can be implemented indirectly through the machine screws 90 passing through the through-holes 88 when the reinforcement plate 50 is installed on the base 12 using the peripheral edges of the through-holes 88 as ground contacts, or directly from the base 12 without specially changing the shape of the flexible cable 42.

The movable section 44 is dislocated in the lateral direction with respect to the connecting part 66, so that the movable section 44 can obtain a proper position even in a limited space in the enclosure case 16. Further, the extended shape (a shape shown in FIG. 1(A)) of the flexible cable 42 is made optimum and the cost can be reduced. Therefore, even if the thickness of the reinforcement plate 50 is reduced, the dimension of the movable section 44 in the lateral direction can be maintained. Additionally speaking, the thickness of the reinforcement plate 50 is decreased, so that the position of height of the AE module 54 to be installed on the module installation part 56 of the nonmovable section 46 can be controlled lower than the cover 14 and the problems related to noise can be solved.

Figure 1A:
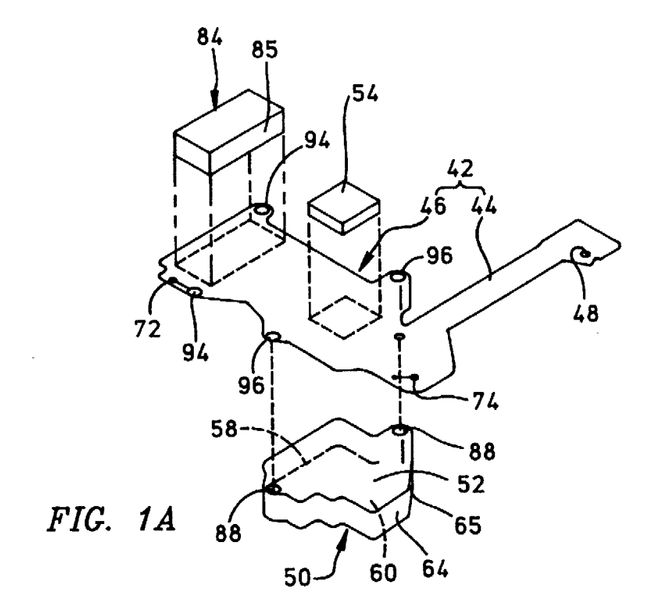
FIGS. 1A–1D show views of the assembly processes of a flexible assembly illustrating a flexible cable structure for a magnetic disk drive according to one embodiment of the present invention.
Figure 1B:
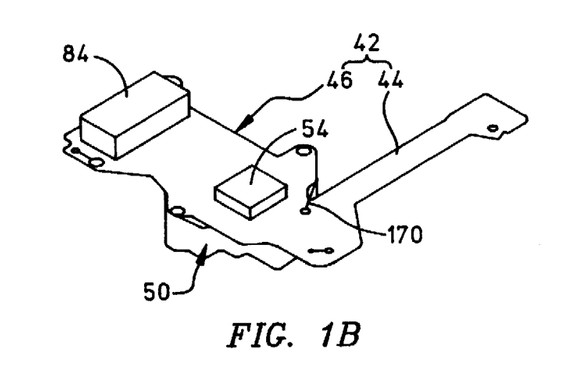
Figure 1C:
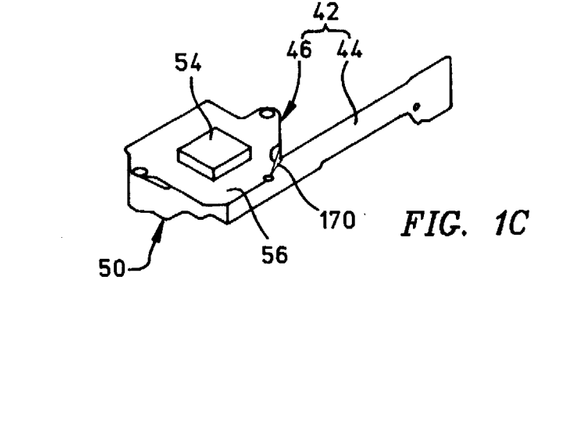
Figure 1D:
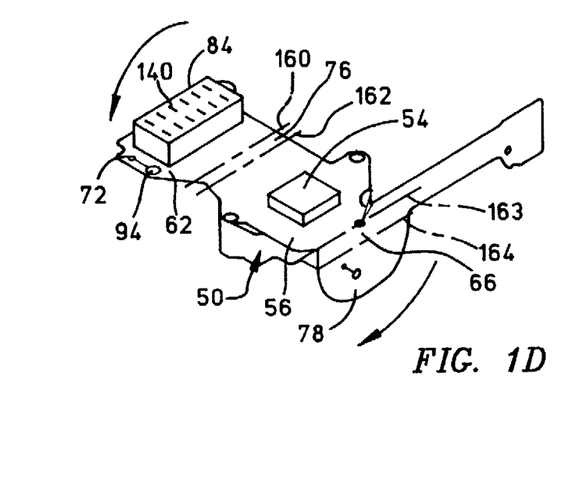

Since the slit 170 is formed in the movable section 44 toward the nonmovable section 46 side, the position of height of the movable section 44 can be changed (a height control of the movable section 44) without giving any influence to the movable section 44 itself by changing the position of the bending line 163 along the slit 170 (shown in FIG. 1(C)). Accordingly, with the same flexible cable 42 utilized, the position to enclose the reinforcement plate 50 by the nonmovable section 46 is changed, or the configuration or dimension of the reinforcement plate 50, so that the height control of the movable section 44 can be realized.

Further, since the seal component 82 is provided on the periphery of the carriage connector 84 between the connector installation part 62 to be installed with the carriage connector 84 and the peripheral edge 81 of the connection aperture 80 and the seal component 82 is pressed by installing the reinforcement plate on the base 12, it is ensured that the air-tightness in the enclosure 16 is obtained without generating the degradation thereof.

Further stated, the motor connector 110 and the carriage connector 84 are respectively connected to the connecting parts 142 and 144 on the card 40 to which the respective spring contacts 138 and 140 correspond. Then, power and signals are transferred not only between the card 40 and the carriage 28 but also between the card 40 and the spindle motor 18. A positioning operation is carried out between the lower surface of the base 12 and the motor connector 110 by fitting the positioning pins 104 and 106 provided on the base 12 into the positioning holes 112 and 114 provided in the motor connector 110 (the positioning pins 104 and 106, and the positioning holes 112 and 114 constitute the engagement means for recesses and projections). A positioning operation is carried out between the lower surface of the base 12 and the carriage connector 84 by fitting the peripheral part 85 of the carriage connector 84 into the connection aperture 80 on the base 12 (the peripheral part 85 of the carriage connector 84 and the connection aperture 80 constitute the engagement means for recess and projection). A positioning operation is carried out between the lower surface of the base 12 and the card 40 by fitting the positioning pins 102 and 106 provided on the base 12 into the positioning holes 116 and 118 provided on the card 40 (the positioning pins 102 and 106, and the positioning holes 116 and 118 constitute the engagement means for recesses and projections). Therefore, the positions of the connecting parts 142 and 144 on the card 40 can be accurately and readily positioned at the respective positions of the springs contacts 138 and 140 provided on the motor connector 110 and the carriage connector 84. Accordingly, the MMC standard dimension of the connector of an external I/F can be easily achieved.

The flexible cable is employed in order to connect the motor connector 110 and the spindle motor 18. The length of the flexible cable can be thus shortened, the cost can be lowered and, what is more, degradation in external noise resistance performance can be suppressed. Thus, the cost is reduced, operation time is shortened, and a high reliability can be obtained.

It is to be understood that various contacts other than the spring contacts may be employed as the contacts for the motor connector 110 and the carriage connector 84. In the case of the spring contacts 138 and 140 in the present embodiment, the thickness of the hard disk drive 10 can be reduced and the connection thereof is also facilitated. If an end of the spring contact is formed with a PC board, in the case of the spring contact, it is ensured that the hardness and the recoverability of the contact are maintained. The flexible cable 108 for connecting the motor connector 110 to the spindle motor 18 is held to the lower surface of the base 12 by fitting the positioning pins 112 and 114 provided on the base 12 into the positioning holes 104 and 106 provided on the motor connector 110, or through the frictional force of the flexible cable 108. An adhesive agent is not required. Therefore, the assembly and reassembly operations become easy.

Furthermore, it should be noted that the positioning pin and the positioning hole as the engagement means for recesses and projections are respectively formed in sides reverse to those in the above-described embodiment. For example, although in the above described embodiment, with the engagement for recesses and projections between the lower surface of the base 12 and the card 40, the positioning pins 102 and 106 are formed on the base 12 side and the positioning holes 116 and 118 are formed on the card 40 side, the positioning holes may be formed reversed on the base side and the positioning pins be formed on the card side.

According to the flexible cable structure for the magnetic disk drive and the magnetic disk drive of the present invention, the assembly characteristics of the magnetic disk drive can be improved and the cost can be reduced.

Although the invention has been described in terms of the specific embodiments, the inventors contemplate modifications and substitution to various components of the invention which would occur to one of ordinary skill in the art, and therefore, would be in the scope of the invention, which is to be limited only by the claims which follow.

We claim:

1. A magnetic disk drive inclusive of a flexible cable structure wherein the disk drive comprises:

a carriage contained in an enclosure case and having a magnetic head for reading magnetic information while positioning is controlled on a magnetic disk;

a circuit board installed on the outer surface of the enclosure case;

a flat flexible cable which is provided in the enclosure case for connecting the carriage and the circuit board; and a reinforcement plate formed in said enclosure case and capable of being installed in the enclosure case so as to cover a connection aperture opened to said circuit board; wherein said flat flexible cable is provided with a movable section supported by the carriage and moved following the carriage and a nonmovable section bent completely about the reinforcement plate so as to enclose the reinforcement plate and being supported by the reinforcement plate, the movable section and the nonmovable section being integrally and continuously formed, and said nonmovable section being provided with a connecting part through which installation parts are installed with electrical components on the outer surface thereof which are connected to the circuit board through said aperture and the movable section having an installation part installed to a carriage connector the flexible cable being a flat layer with first and second flat surfaces, the reinforcement plate supporting a first nonmovable flat layer portion of the nonmovable section immediately adjacent said connecting part so that first and second flat surfaces of said first nonmovable flat layer portion lie in a first plane and the reinforcement plate supporting a second nonmovable flat layer portion of the nonmovable section that is contiguous with said movable section so that first and second flat surfaces of the second nonmovable portion lie in a second plane that is substantially perpendicular to said first plane.

2. A magnetic disk drive according to claim 1, wherein a portion of the movable section is separated from the nonmovable section so as to provide the movable section with a height elevated above a top surface of the reinforcement plate.

3. A magnetic disk drive according to claim 1, wherein a seal component is provided along an edge of said aperture so that the seal component is pressed by installing the connecting part.

4. A connector apparatus for a disk drive comprising:

a flat flexible cable having movable and nonmovable portions which are integral with respect to one another, each of the movable and nonmovable portions having first and second oppositely facing flat surfaces;

a mounting plate having top and bottom surfaces which are joined and bounded by first and second oppositely facing side surfaces and third and fourth oppositely facing side surfaces, with the top surface being contiguous with the first side surface, the first side surface being contiguous with the bottom surface, the bottom surface being contiguous with the second side surface and the second side surface being contiguous with the top surface so that the top surface, first side surface, bottom surface and second side surface define a closed loop about the mounting plate;

the nonmovable portion of the flat flexible cable being wrapped snugly around said top surface, first side surface, bottom surface and second side surface so as to tightly enclose the mounting plate except for said third and fourth side surfaces of the mounting plate and having top and bottom portions and first and second side portions which have first flat surfaces immediately adjacent to and correspondingly engaging the top and bottom surfaces and the first and second side surfaces respectively of the mounting plate and having second flat surfaces that face outwardly from said mounting plate;

a cable connector mounted to the second flat surface of said bottom portion of the nonmovable portion of the flat flexible cable so that the bottom portion of the nonmovable portion of the flat flexible cable is sandwiched between the bottom surface of the mounting plate and the cable connector for connecting the flat flexible cable to another component;

at least a portion of the movable portion of the flat flexible cable being integral with the second side portion of the nonmovable portion of the flat flexible cable with the first and second flat surfaces of the movable portion being coextensive with the first and second flat surfaces of the second side portion of the nonmovable portion of the flat flexible cable; and the bottom surface of the mounting plate supporting the bottom portion of the nonmovable portion of the flat flexible cable with the first and second flat surfaces of the bottom portion lying in a first plane and the second surface of the mounting plate supporting the second portion of the nonmovable portion of the flat flexible cable with the first and second flat surfaces of the second portion lying in a second plane that is substantially perpendicular to said first plane so that first and second flat surfaces of said at least a portion of the movable portion, which is integral with said second portion of the nonmovable portion, is positioned substantially in said second plane.

5. A connector apparatus as claimed in claim 4 wherein an electronic module is mounted on the second surface of the top portion of the nonmovable portion of the flat flexible cable and is electrically connected thereto with the top portion of the nonmovable portion of the flat flexible cable being sandwiched between the electronic module and the top surface of the mounting plate.

6. A connector apparatus as claimed in claim 4 wherein the top portion and the second side portion of the nonmovable portion of the flat flexible cable are separated by a slit so that the movable portion of the flat flexible cable has an extended height portion above the top portion of the nonmovable portion of the flat flexible cable.

7. A connector apparatus as claimed in claim 4 wherein said mounting plate is substantially rectangular.

8. A connector apparatus as claimed in claim 4 including:

the nonmovable portion of the flat flexible cable having a flap which is integral with the second side portion of the nonmovable portion of the flat flexible cable; and said flap extending below and secured to the second surface of the bottom portion of the nonmovable portion of the flat flexible cable so as to secure an end of the movable portion to said mounting plate.

9. A connector apparatus as claimed in claim 4 wherein the mounting plate has at least one projection extending downward from its bottom surface and the bottom portion of the nonmovable portion of the flat flexible cable has an aperture for receiving said projection so as to position said cable connector.

10. A connector apparatus as claimed in claim 4 wherein said cable connector has at least one spring biased contact.

11. A connector apparatus as claimed in claim wherein 4 the first surface of the top portion of the flat flexible cable is bonded to the top surface of the mounting plate.

12. A connector apparatus as claimed in claim 11 wherein an electronic module is mounted on the second surface of the top portion of the nonmovable portion of the flat flexible cable and is electrically connected thereto.

13. A connector apparatus as claimed in claim 12 wherein the top portion and the second side portion of the nonmovable portion of the flat flexible cable are separated by a slit so that the movable portion of the flat flexible cable has an extended height portion.

14. A connector apparatus as claimed in claim 13 wherein said mounting plate is substantially rectangular.

15. A connector apparatus as claimed in claim 14 including:

the nonmovable portion of the flat flexible cable having a flap which is integral with the second side portion of the nonmovable portion of the flat flexible cable; and said flap extending below and secured to the second surface of the bottom portion of the nonmovable portion of the flat flexible cable so as to secure an end of the movable portion to said mounting plate.

16. A connector apparatus as claimed in claim 15 wherein the mounting plate has at least one projection extending downward from its bottom surface and the bottom portion of the nonmovable portion of the flat flexible cable has an aperture for receiving said projection so as to position said cable connector.

17. A connector apparatus as claimed in claim 16 wherein said cable connector has at least one spring biased contact.

18. A disk drive including the connector apparatus of claim the disk drive including:

a housing having a base plate and a cover, the base plate having top and bottom surfaces;

said another component being a circuit board connected to the bottom surface of the base plate and having a board connector with a body portion for mating with the cable connector;

the base plate having an aperture; and a body portion of the cable connector extending through the aperture in the base plate and having contacts which mate with contacts associated with the board connector.

19. A disk drive as claimed in claim 18 including:

a motor having a spindle for rotating a magnetic disk;

a portion of the motor sealably extending through the base plate so as to be exposed to said circuit board, the circuit board having at least one contact; and another flat flexible cable connected to an exposed portion of the motor, said another flat flexible cable having at least one spring contact which contacts the contact of the circuit board; and the base plate having at least one pin which is received in an aperture in the circuit board for registering contact between the spring contact and the contact.

20. A disk drive as claimed in claim 18 including:

an electrically conductive screw;

each of the top portion and the bottom portion of the nonmovable portion of the flat flexible cable and the mounting plate having an aperture for receiving the screw; and the screw being secured to base plate for connecting the mounting plate to the base plate and grounding the flat flexible cable thereto.

21. A disk drive as claimed in claim 18 including:

a seal; and the aperture in the base plate having a recess which snugly receives the seal for sealing the cable connector of the flat flexible cable to the base plate.

22. A disk drive as claimed in claim 18 including:

a motor with a spindle, the motor being mounted to the top surface of the base plate so as to be located within said housing;

a magnetic disk supported for rotation by the spindle;

an actuator mounted to the top surface of said base plate so as to be located in said housing;

an elongated carriage mounted at one end to the actuator and a magnetic head mounted on an opposite end of the carriage adjacent a surface of the magnetic disk, the actuator having a motor for positioning the magnetic head at various positions relative to the surface of the disk via the carriage; and the movable portion of the flat flexible cable having a terminal end remote from the second side portion of the nonmovable portion of the flat flexible cable which is mounted to the carriage and is electrically connected to the magnetic head and the actuator motor.

23. A disk drive as claimed in claim 22 wherein the top portion of the flat flexible cable is bonded to the top surface of the mounting plate.

24. A disk drive as claimed in claim 23 wherein an electronic module is mounted on a top surface of the top portion of the nonmovable portion of the flat flexible cable and is electrically connected thereto.

25. A disk drive as claimed in claim 24 wherein the top portion and the second side portion of the nonmovable portion of the flat flexible cable are separated by a slit so that the movable portion of the flat flexible cable has an extended height portion.

26. A disk drive as claimed in claim 25 wherein said mounting plate is substantially rectangular.

27. A disk drive as claimed in claim 26 including:

the nonmovable portion of the flat flexible cable having a flap which is integral with the second side portion of the nonmovable portion of the flat flexible cable; and said flap extending below and secured to the second surface of the bottom portion of the nonmovable portion of the flat flexible cable so as to secure an end of the movable portion to said mounting plate.

28. A disk drive as claimed in claim 27 including:

a portion of the motor for the spindle sealably extending through the base plate so as to be exposed to said circuit board, the circuit board having at least one contact; and another flat flexible cable connected to an exposed portion of the motor, said another flat flexible cable having at least one spring contact which contacts the contact of the circuit board; and the base plate having at least one pin which is received in an aperture in the circuit board for registering contact between the spring contact and the contact.

29. A disk drive as claimed in claim 28 including:

an electrically conductive screw;

each of the top portion and the bottom portion of the nonmovable portion of the flat flexible cable and the mounting plate having an aperture for receiving the screw; and the screw being secured to the base plate for connecting the mounting plate to the base plate and grounding the flat flexible cable thereto.

30. A disk drive as claimed in claim 29 including:

a seal; and the aperture in the base plate having a recess which snugly receives the seal for sealing the cable connector of the flat flexible cable to the base plate.

* * * * *